(12) United States Patent
Taketoshi

(10) Patent No.: US 6,411,241 B1
(45) Date of Patent: Jun. 25, 2002

(54) A/D CONVERTER

(75) Inventor: Osamu Taketoshi, Kadoma (JP)

(73) Assignee: Matsushita Electric Industrial Co., Inc. (JP)

( * ) Notice: Subject to any disclaimer, the term of this patent is extended or adjusted under 35 U.S.C. 154(b) by 0 days.

(21) Appl. No.: 09/517,622

(22) Filed: Mar. 3, 2000

(30) Foreign Application Priority Data

Mar. 4, 1999 (JP) ............................................ 11-056518

(51) Int. Cl.[7] ................................................ H03M 1/12
(52) U.S. Cl. ...................................... 341/155; 341/118
(58) Field of Search ................................ 341/155, 110, 341/118, 120, 156, 172, 158, 162; 340/347

(56) References Cited

U.S. PATENT DOCUMENTS 4,654,635 A * 3/1987 Van De Plassche ......... 340/347
5,148,166 A * 9/1992 Ribner ........................ 341/143
5,864,310 A * 1/1999 Khorramabadi ............. 341/118

FOREIGN PATENT DOCUMENTS

JP 06085672 A 3/1994

* cited by examiner

Primary Examiner—Peguy Jeanpierre
Assistant Examiner—Joseph Lauture
(74) Attorney, Agent, or Firm—Parkhurst & Wendel, LLP

(57) ABSTRACT

An A/D converter guarantees high conversion precision and reduces power consumption not only in a standby state but in any other states. Therefore, a subtraction circuit is added to the A/D converter obtain a difference between a reference voltage and an analog signal, and an analog signal stored as a reference voltage is used. The difference is converted only by an A/D conversion unit for converting lower bits, and an operation mode for stopping the operation of an idle conversion unit is designed, thereby to perform an analog-to-digital converting operation.

14 Claims, 9 Drawing Sheets (a) NORMAL CONVERSION MODE (b) CONVERSION MODE WHEN NUMBER OF BITS IS REDUCED

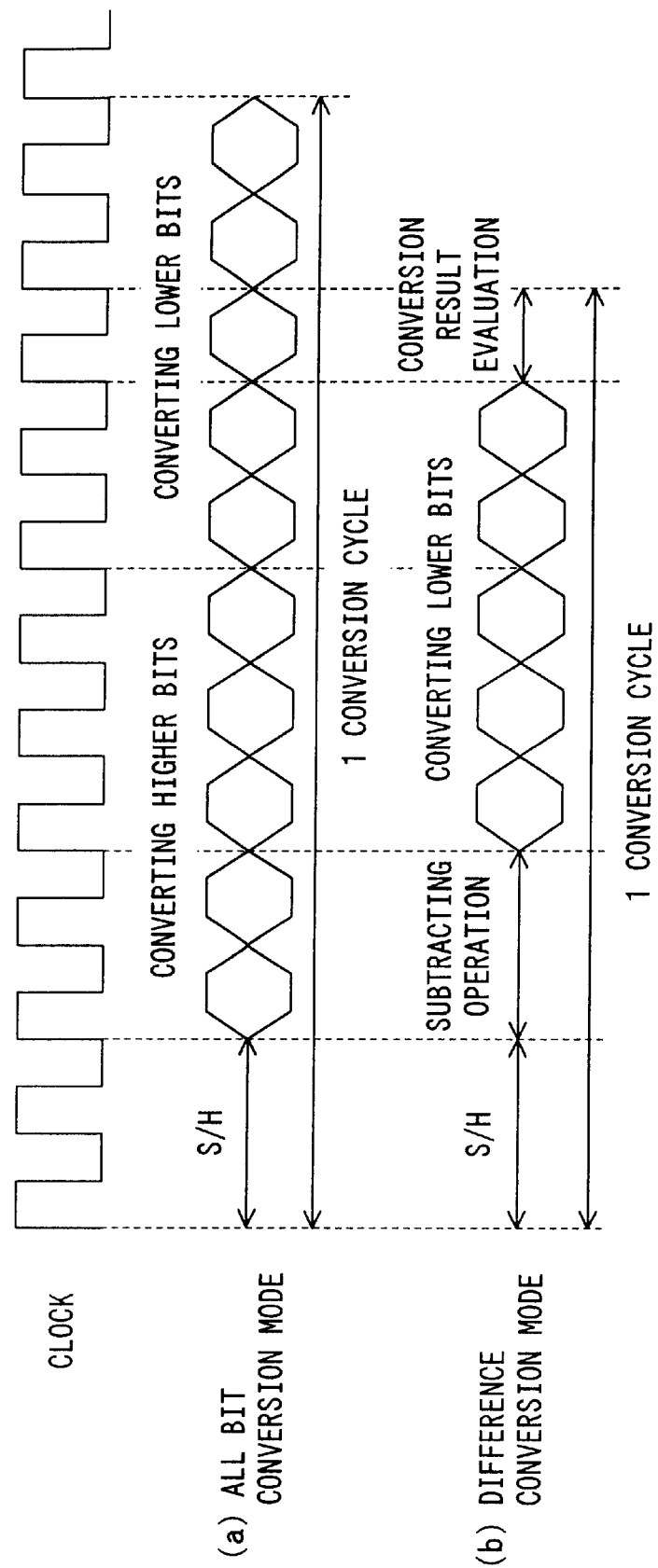

A/D CONVERTER

FIELD OF THE INVENTION

The present invention relates to an A/D converter which is provided as a peripheral circuit of a microprocessor and the like, and converts an analog input from an analog value to a digital value.

BACKGROUND OF THE INVENTION

FIG. 2 shows a block diagram of an A/D converter built in a conventional microprocessor. In FIG. 2, 1 is the body of the A/D converter. 101 is an S/H circuit for performing a sample holding operation of an input analog signal. A higher bit A/D conversion unit 102 and a lower bit A/D conversion unit 103 convert an input analog signal into a digital signal. The lower bit A/D conversion unit 103 stops the operation according to an operation stop signal.

FIG. 3 shows a timing chart of the operation of a conventional A/D converter. In FIG. 3, a normal conversion mode is shown in a second stage, and a saving conversion mode for reduced bits is shown in a third stage. In the saving conversion mode, only the higher bit A/D conversion unit 102 performs a converting operation with the operation of the lower bit A/D conversion unit 103 suppressed.

Described below will be the operation of the conventional A/D converter having the above described configuration.

The A/D converter 1 has two operation modes. One is the normal operation mode in which both higher and lower bits are converted. The other is the conversion mode for reduced bits in which only higher bits are converted.

In the normal operation mode, an input analog signal is sample-held by the S/H circuit 101, and the sample-held analog signal is processed in the analog-to-digital converting operation for higher bits by the higher bit A/D conversion unit 102. Then, lower bits are processed in the analog-to-digital converting operation by the lower bit A/D conversion unit 103, thereby outputting a digital conversion value.

In the conversion mode for reduced bits, an input analog signal sample-held by the S/H circuit 101 is processed in the analog-to-digital converting operation only by the higher bit A/D conversion unit 102. At this time, the lower bit A/D conversion unit 103 stops its operation according to the operation stop signal. Stopping the lower bit A/D conversion unit 103 lowers the conversion precision, but the electric power can be saved.

FIG. 4 shows an example of the conventional A/D converter.

In FIG. 4, S/H circuits 201 and 202 perform a sample holding operation on an analog signal. A subtraction circuit 203 performs a subtracting operation on an input analog signal, and outputs a difference. An A/D conversion unit includes a higher bit conversion unit 240 and a lower bit conversion unit 250. The higher bit conversion unit 240 performs an analog-to-digital converting operation on higher bits while the lower bit conversion unit 250 performs an analog-to-digital converting operation on lower bits. A stop control signal is input to the lower bit conversion unit 250. When the stop control signal is valid, the lower bit conversion unit 250 stops its operation.

The higher bit conversion unit 240 and the lower bit conversion unit 250 further include the following components. That is, A/D conversion units 210 and 212 convert analog signals into m- and n-bit digital signals respectively. A D/A conversion unit 211 converts an m-bit digital signal into an analog signal. A register 220 stores m-bit digital data. A digital adder 230 outputs an (m+n) bit digital signal by adding m higher bits and n lower bits.

Described below will be the operation of the conventional A/D conversion unit with the above described configuration.

First, an analog signal reproduced by the S/H circuit 201 is converted into m higher bits digital signal by the A/D conversion unit 210 in the first stage. Next, in the normal operation mode, the S/H circuit 201 obtains the difference between the analog signal reproduced by the S/H circuit 201 and the analog signal reproduced by the D/A conversion unit 211 through the subtraction circuit 203. After the result is sample-held by the S/H circuit 202, it is converted into a digital signal of n lower bits by the A/D conversion unit 212 at the subsequent stage. Finally, an (m+n) bit digital signal is obtained by adding the m higher bits temporarily stored by the register 220 and the n lower bits converted by the A/D conversion unit 212.

In addition, in the electric power saving operation for reduced bits, the lower bit conversion unit 250 is stopped according to the stop control signal, and the converting operation is performed by the S/H circuit 201, the higher bit conversion unit 240, and the digital adder 230.

There is a method for stopping a circuit for reducing power consumption in an A/D converter as a peripheral circuit mounted in a microprocessor, etc.

However, to reduce the power consumption with the conversion precision maintained, the conventional technology shown in FIG. 2 has the problem that the effect of reducing power consumption works only in a standby state, and that the conversion precision is lowered in the saving mode.

The present invention has been developed based on the above described background, and aims at providing an A/D converter for realizing both reduction of power consumption and guarantee of the conversion precision.

SUMMARY OF THE INVENTION

To solve the above described problems, the A/D converter according to a first aspect of the present invention has a configuration in which a difference between previously input and currently input analog signals is processed in the analog-to-digital converting operation, added to an A/D converted value of the previously input analog signal, and is then output. A difference of a smaller value can be processed in the analog-to-digital converting operation with the conversion precision maintained.

In addition, the A/D converter according to a second aspect of the present invention includes a plurality of A/D conversion units, stores analog signals input to the plurality of A/D conversion units and digital signals converted, and stops part of the A/D conversion units. Then, only the remaining A/D conversion units A/D convert the differences (that is, the signals sequentially obtained by subtracting the reference analog signals stored previously in a time series from the current analog signals), add the results to the stored digital signals, and then output the sums. Since only the remaining conversion units perform the converting operations while part of the A/D conversion units are in the inactive state, the electric power can be saved by the amount supposed to be consumed by the inactive A/D conversion units. Furthermore, since all bit conversion values stored at the reference point are added to the output digital signal obtained after the A/D conversion of the change in time series of the input analog signal based on a signal at a reference point, the conversion precision can also be maintained.

In addition, to solve the above described problems, the A/D converter according to a third aspect of the present invention further adds an analog subtraction circuit and a selector to the conventional A/D converter. With the configuration and by converting a voltage change of an input analog signal only by a lower bit A/D conversion circuit, power consumption can be reduced with the conversion precision successfully maintained.

Furthermore, to solve the above described problems, the A/D converter according to a fourth aspect of the present invention has a unit for detecting the overflow of conversion result of the lower bit A/D conversion circuit, added to the configuration of the above described first aspect of the present invention. With this configuration, in addition to the effect of the first aspect of the present invention, the converting operation can be optimized, thereby further reducing the power consumption.

BRIEF DESCRIPTION OF THE DRAWINGS

FIG. 9 is a timing chart of the A/D converter according to the second embodiment of the present invention.

DESCRIPTION OF THE EMBODIMENTS

The first embodiment of the present invention will be described below by referring to FIGS. 1, 5, 6, and 7.

Figure 1:
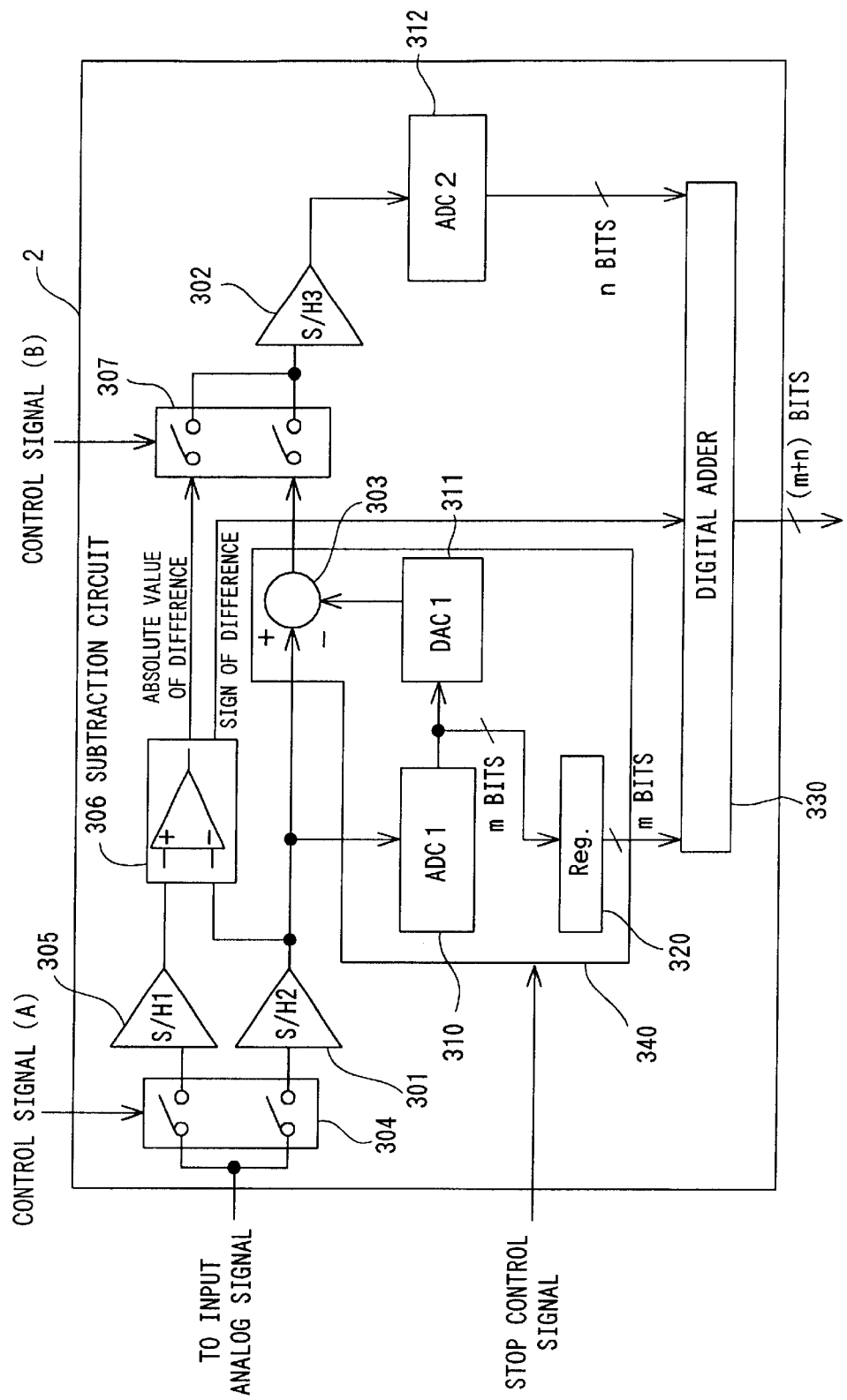
FIG. 1 is a block diagram of the configuration of the A/D converter according to a first embodiment of the present invention.
Figure 2:
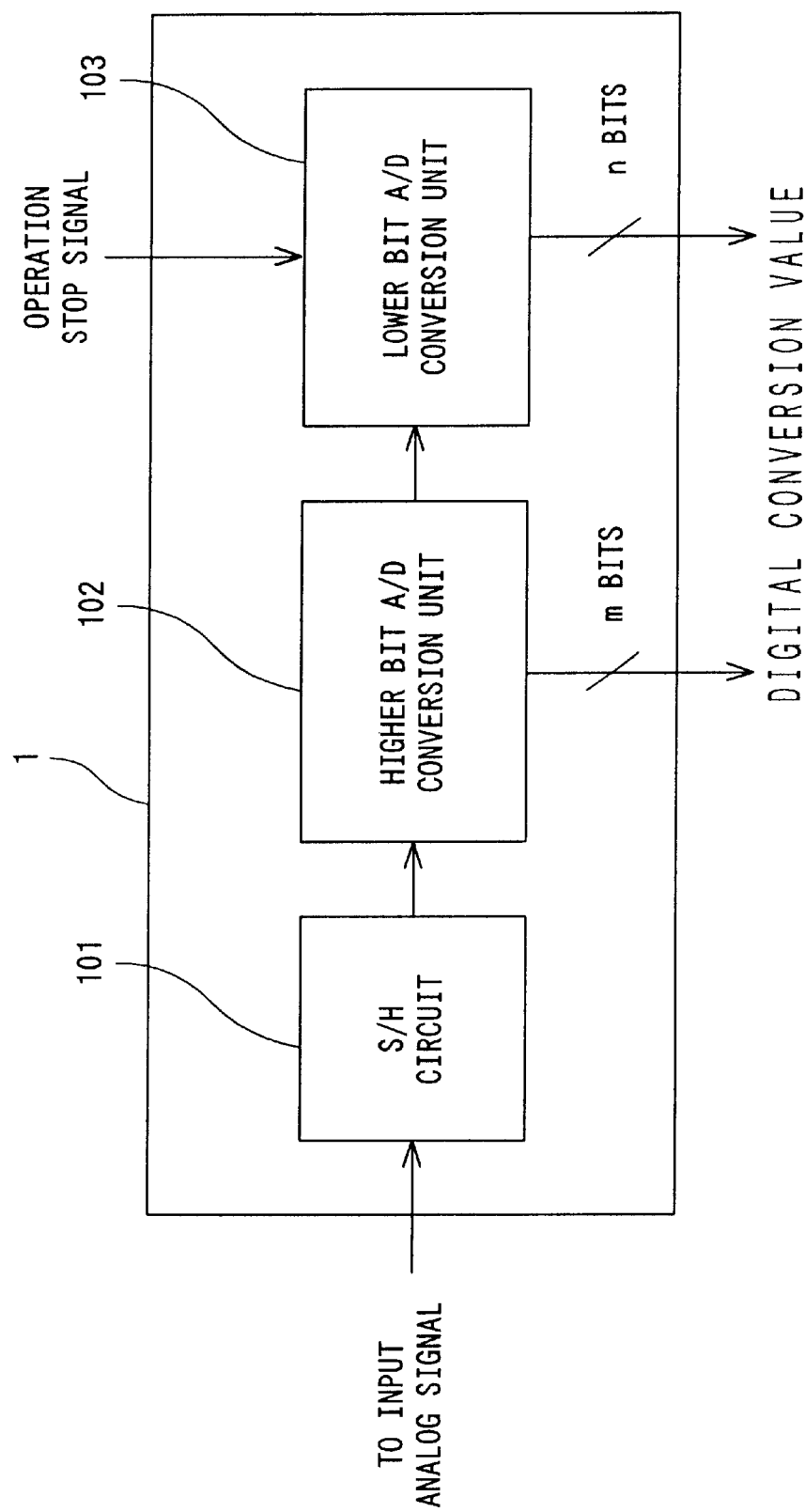
FIG. 2 is a block diagram of the configuration of the conventional technology.
Figure 3:
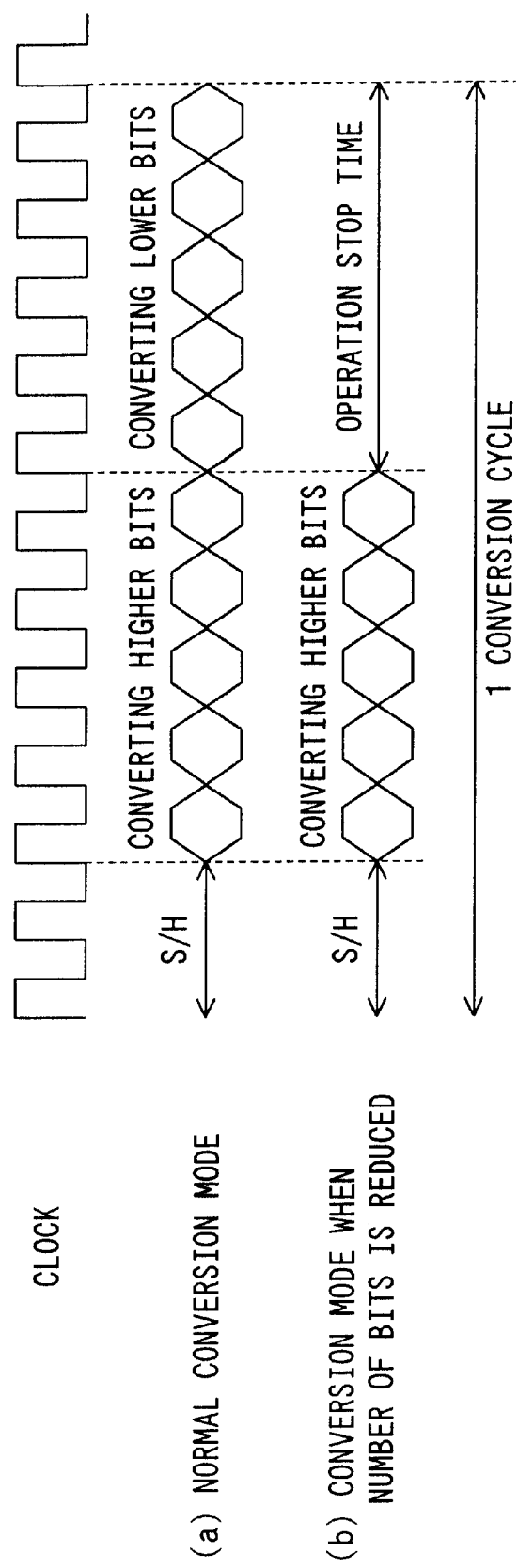
FIG. 3 is a timing chart of the conventional A/D converter.
Figure 4:
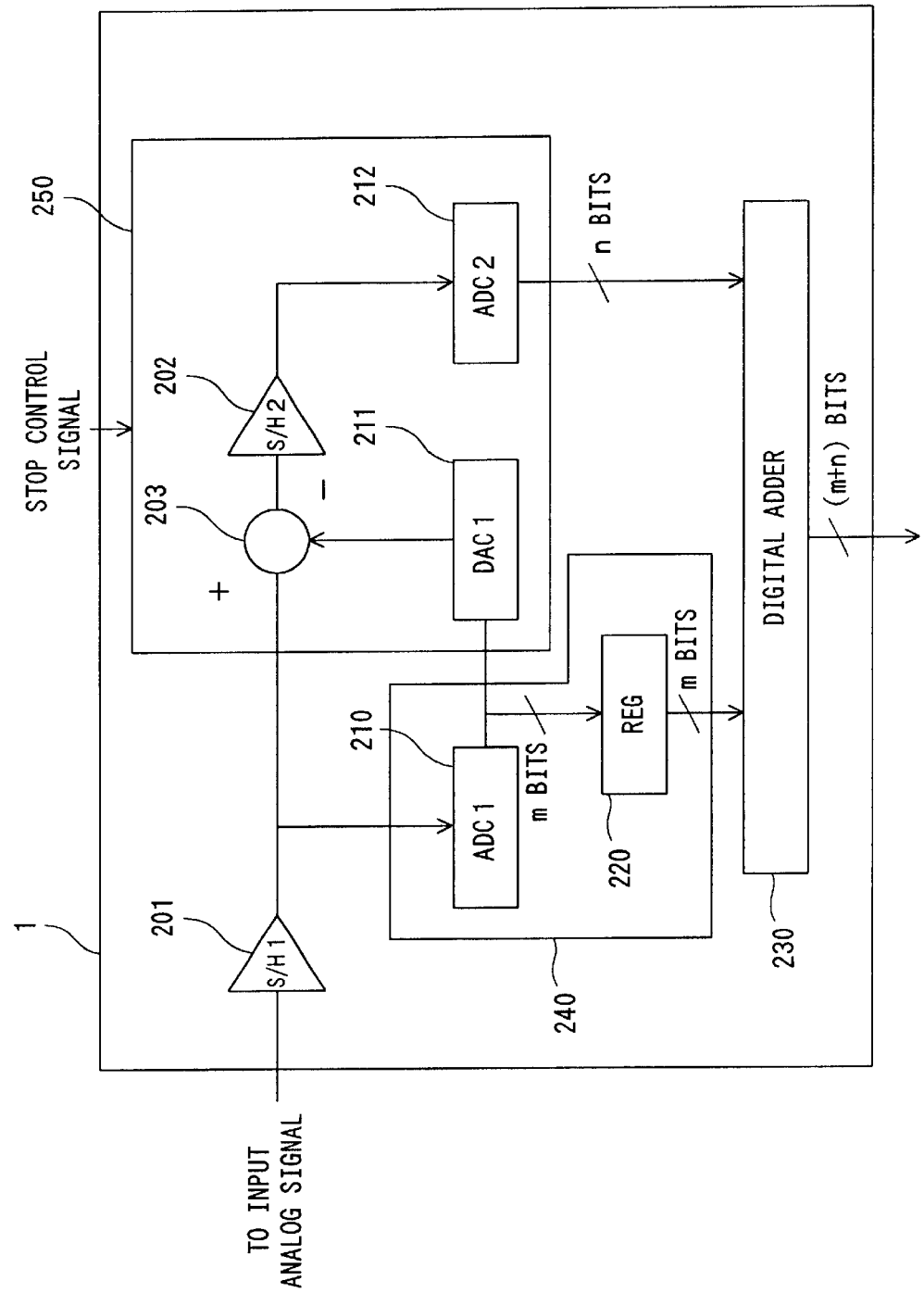
FIG. 4 is a block diagram of the configuration of the conventional A/D conversion unit.

FIG. 1 is a block diagram of the configuration of the A/D converter according to the first embodiment of the present invention.

In FIG. 1, a selector 304 turns ON/OFF the connection between an input analog signal and S/H circuits 301 and 305 described later, and is controlled according to a control signal A.

The S/H circuits 301 and 305 perform a sample holding operation on an input analog signal. An output of the S/H circuit 301 is connected to a subtraction circuit 303 and an A/D conversion unit 310 for converting higher bits described later. An output of the S/H circuit 305 is connected to a subtraction circuit 306 described later.

An S/H circuit 302 performs a sample holding operation on an output signal of a selector 307 described later. The output is connected to an A/D conversion unit 312 for converting lower bits described later.

The subtraction circuit 306 performs a subtracting process on outputs of the S/H circuits 301 and 305, and outputs the absolute value and the sign of the difference. The absolute value of the difference is output to the selector 307 described later, and the sign is output to a digital adder 330.

The selector 307 outputs only one of the outputs of the subtraction circuit 306 and the subtraction circuit 303 described later to the S/H circuit 302, and is controlled according to a control signal B.

The A/D conversion unit 310 for converting higher bits performs an analog-to-digital converting operation on the output of the S/H circuit 301, and outputs an m-bit digital value to a D/A conversion unit 311 and a register 320 described later. It also stops the operation according to the stop control signal.

Similarly, the A/D conversion unit 312 for converting lower bits performs an analog-to-digital converting operation on an output of the S/H circuit 302, and output a converted n-bit digital value to the digital adder described later.

The D/A conversion unit 311 converts the converted digital value of the A/D conversion unit 310 to the analog value, and reproduces the digital signal roughly converted by the A/D conversion unit 310 to an analog signal. In addition, it stops the operation according to the stop control signal.

The register 320 stores the digital signal obtained in the analog-to-digital converting operation by the A/D conversion unit 310. The stored contents are output to the digital adder 330 described later. In addition, the contents of the register are reset according to the stop control signal.

The subtraction circuit 303 performs a subtracting process between the analog signal stored by the SIH circuit 301 and the analog signal converted by the D/A conversion unit 311. Then, a result of the subtracting process is output to the selector 307. In addition, the operation is stopped according to the stop control signal.

The digital adder 330 comprises an internal register and an adder, and performs an adding process on the output of the register 320 and the A/D conversion unit 312 according to the sign information from the subtraction circuit 306. Then, it generates a final result by performing the analog-to-digital converting operation on an input analog signal.

Figure 5:
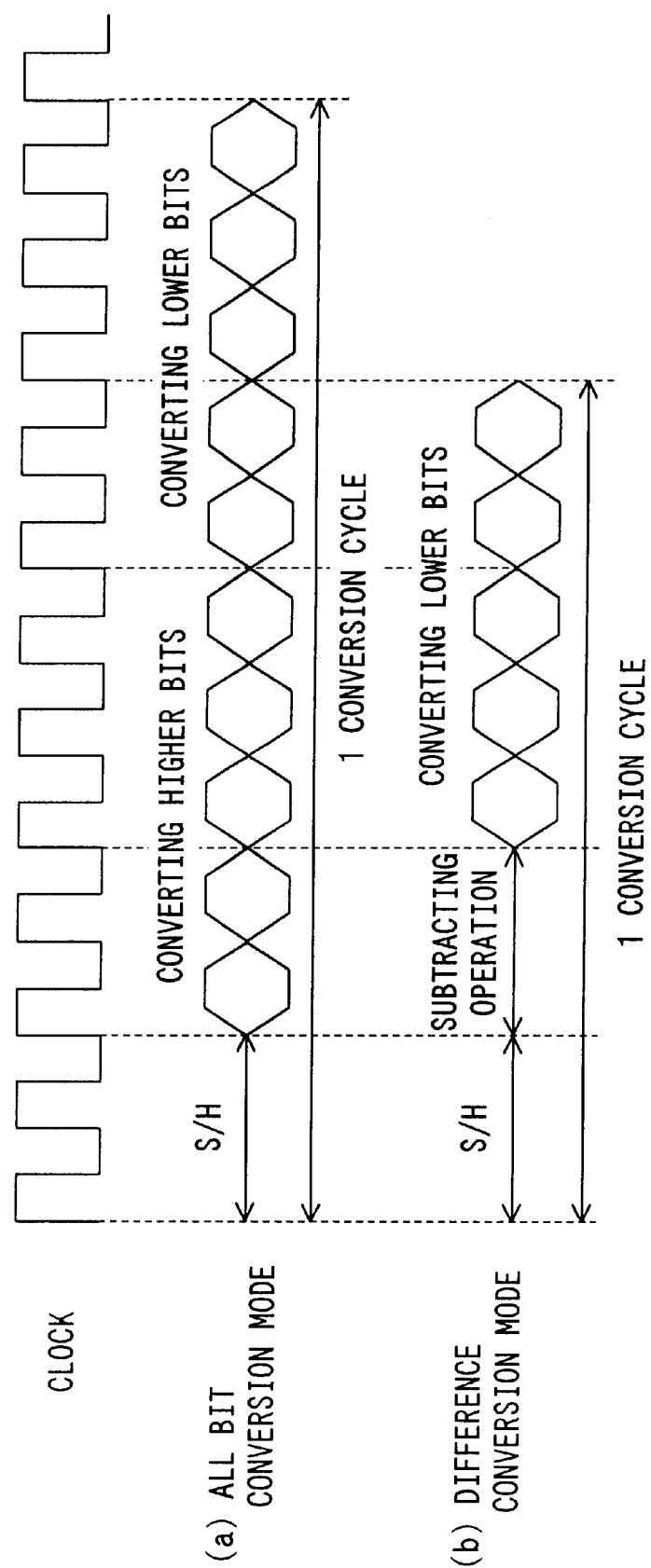
FIG. 5 is a timing chart of the A/D converter according to the first embodiment of the present invention.

FIG. 5 is a timing chart of the converting operation by the A/D converter according to the first embodiment of the present invention, and shows the contents of the analog-to-digital converting operation corresponding to a clock signal in each operation mode. In FIG. 5, the second stage shows the conversion mode in which both A/D conversion unit 310 for converting higher bits and A/D conversion unit 312 for converting lower bits are operated. This mode is hereinafter referred to as an all bit conversion mode. The third stage shows a conversion mode in which only the A/D conversion unit 312 for converting lower bits is operated. This mode is hereinafter referred to as a difference conversion mode.

Figure 6:
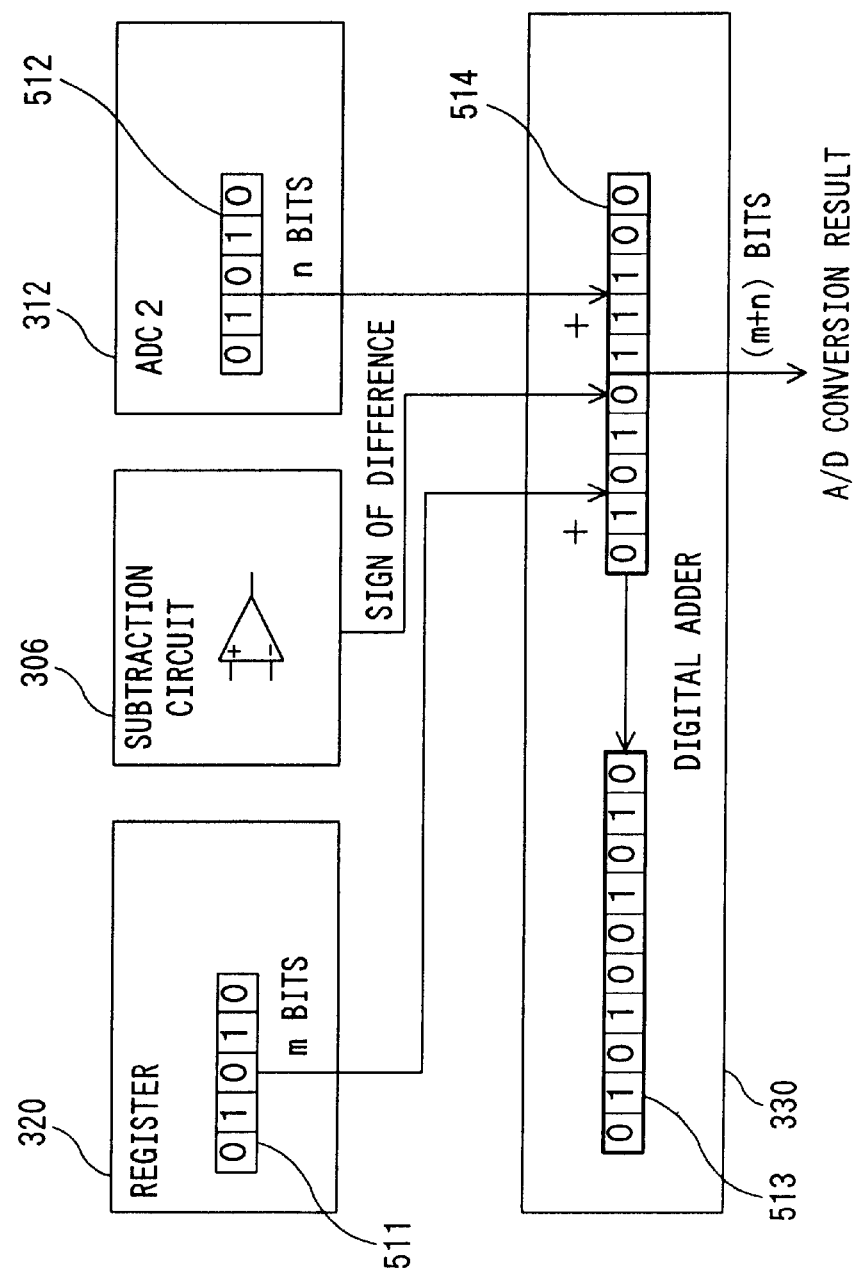
FIG. 6 is a flowchart of the process of the adder in all bit conversion mode according to the first embodiment of the present invention.
Figure 7:
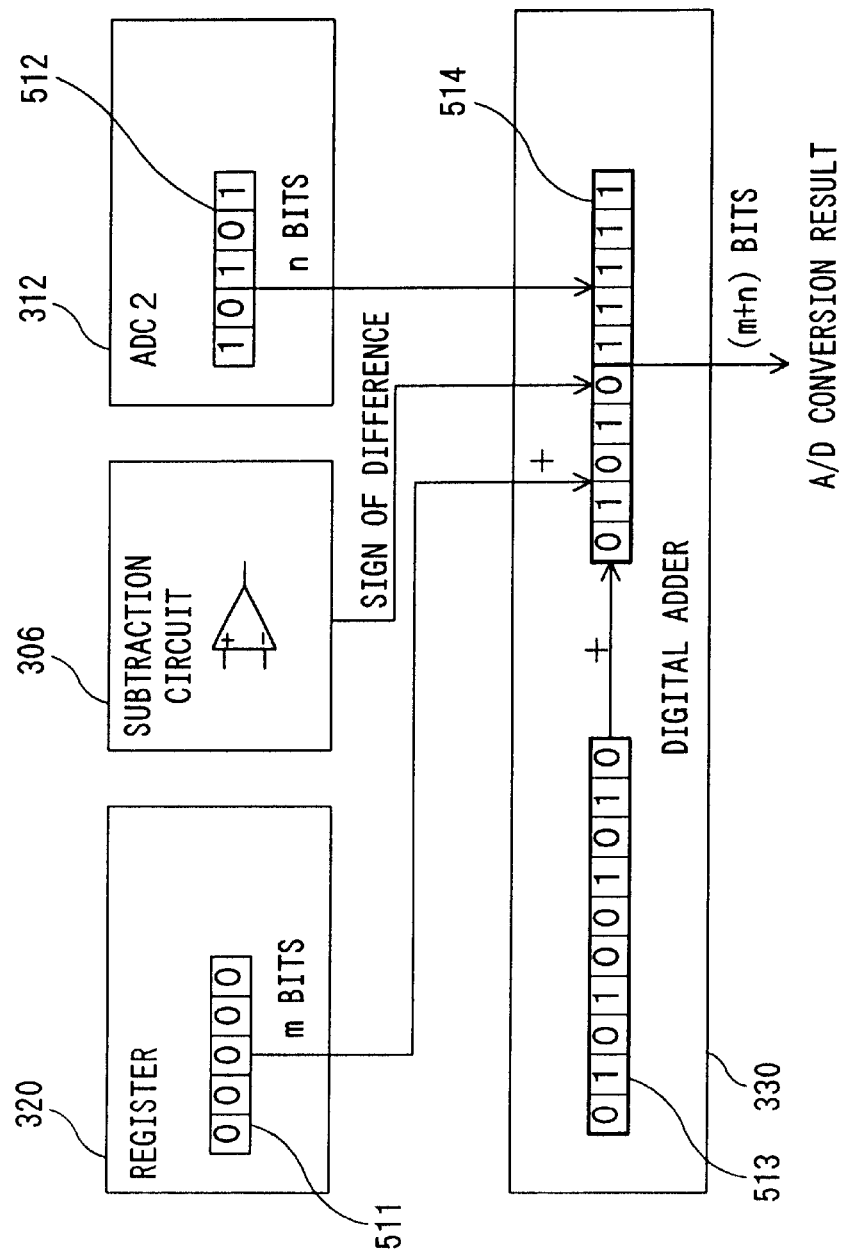
FIG. 7 is a flowchart of the process of the adder in the difference conversion mode according to the first embodiment of the present invention.

FIGS. 6 and 7 show the process of the digital adder 330 in the all bit conversion mode and the difference conversion mode respectively. The register 320 and the A/D conversion unit 312 for converting lower bits have internal registers 511 and 512 respectively to store a digital value of a higher bit conversion result and a digital value of a lower bit conversion result. The digital adder 330 comprises an internal register 513 and an adder 514, adds up the results of the internal registers 511 and 512 in the all bit conversion mode shown in FIG. 6, outputs the process result to the internal register 513, and outputs it as an A/D conversion result. In the difference conversion mode shown in FIG. 7, according to the sign information of the difference of the subtraction circuit 306, the adding and subtracting operations for the register 512 are performed on the addition results of the digital values of the registers 511 and 513, and the process result is output as an A/D conversion result.

Described below will be the operation of the A/D converter according to the present invention with the above described configuration.

The feature of the A/D converter according to the present invention is that a difference is computed between an input analog signal and a previously input and stored analog signal, and a necessary analog-to-digital converting operation is performed only by an A/D conversion unit for converting lower bits with the conversion precision guaranteed and the power consumption reduced.

Described below first will be the converting operation in the all bit conversion mode.

An input analog signal converted in the all bit conversion mode is used as a reference voltage in the difference conversion mode. The converting operation in the all bit conversion mode is as follows.

(1) Sample Holding Operation of an Input Analog Signal

All analog switches of the selector 304 are connected to the circuit according to a control signal A, and an input analog signal is sample-held by the SIH circuits 301 and 305. This operation corresponds to the section S/H in the timing chart shown in FIG. 5.

(2) Rough Conversion of an Input Analog Signal (Higher Bit Conversion)

An analog signal stored by the S/H circuit 301 is processed in the analog-to-digital converting operation by the A/D conversion unit 310. In this example, the A/D conversion unit 310 performs a rough converting operation for m higher bits. The converted m higher bit digital signal is stored in the register 511 as converted higher bits.

Concurrently, a process of subtracting an input analog signal is performed by the subtraction circuit 306. In the all bit conversion mode, since a signal input to the subtraction circuit 306 is an input analog signal, the subtraction result is zero, and the sign information output to the digital adder 330 is + (plus).

The above described operation corresponds to the higher bit conversion section in the timing chart shown in FIG. 5.

(3) Regeneration of a Roughly-converted Signal (in the Higher Bit Converting Operation)

The m higher bit digital signal roughly converted in (2) above is regenerated into an analog signal by the D/A conversion unit 311. The conversion is started by the D/A conversion unit 311 immediately after the completion of the conversion by the A/D conversion unit 310 in the previous stage.

The above described operation corresponds to the higher bit conversion section in the timing chart shown in FIG. 5.

(4) Subtracting Process Between an Input Analog Signal and a Rough Conversion Result A subtracting operation between the analog signal generated in (3) above and the analog signal stored by the S/H circuit 301 is performed by the subtraction circuit 303. Thus, among inputs of the analog signal, the component of the converted higher bits of the analog signal can be removed. Then, the operation result obtained by the subtraction circuit 303 is sample-held by the S/H circuit 302 through the selector 307, thereby preparing for the minute conversion (lower bit conversion) at the subsequent stage.

At this time, an analog switch is controlled such that the output of the subtraction circuit 303 can be the output of the selector 307 according to the control signal B.

The above described operation corresponds to the higher bit conversion section in the timing chart shown in FIG. 5.

(5) Minute Conversion of an Input Analog Signal (Lower Bit Conversion)

The lower bits are minutely processed by processing an analog signal stored by the S/H circuit 302 again in the analog-to-digital converting operation by the A/D conversion unit 312 for converting lower bits.

The above described operation corresponds to the lower bit conversion section in the timing chart shown in FIG. 5.

(6) Generating a Digital Conversion Value

The digital adder 330 receives the following data from each component as shown in FIG. 6. That is, it receives the conversion data of m higher bits from the register 320, the conversion data of n lower bits from the A/D conversion unit 312 for converting lower bits, and + (plus) sign information from the subtraction circuit 306.

The digital adder 330 regards the sign information of the subtraction circuit 306 as the sign bit of the conversion data of n lower bits, and performs the process of adding the information to the conversion data of m higher bits as shown in FIG. 6, thereby generating the final conversion result.

At this time, the conversion result is stored by the internal register 513 for the operation in the difference conversion mode.

Described below will be the converting operation in the difference conversion mode.

The difference from the reference voltage which is an input analog signal obtained through the conversion in the all bit conversion mode is computed, and the analog-to-digital converting operation is performed only by the A/D conversion unit for converting lower bits. The converting operation in the difference conversion mode is as follows.

(1) Sample Holding Operation for an Input Analog Signal

According to the control signal A, the analog switch of the selector 304 only on the S/H circuit 301 side, and the input analog signal is sample-held by the S/H circuit 301. In the difference conversion mode, the operations of the A/D conversion unit 310 for converting higher bits, the D/A conversion unit 311, and the subtraction circuit 303 are stopped, and the register 320 is reset to enter the initial state according to the stop control signal.

The operation corresponds to the section S/H in the timing chart shown in FIG. 5.

(2) Subtracting Process Between an Input Analog Signal and a Reference Voltage

The subtraction circuit 306 outputs an absolute value of the difference between the reference voltage stored by the S/H circuit 305 and the input analog signal stored by the S/H circuit 301. The operation result is output to the S/H circuit 302 through the selector 307, and stored by the S/H circuit 302. In this example, the selector 307 performs control such that an output of the subtraction circuit 306 can be selected according to the control signal B.

In addition, the sign of the difference between the reference voltage and the input analog signal is output to the digital adder 330. The sign of the difference is - (minus) when the reference voltage is larger than the input analog signal, and is + (plus) otherwise. Then, based on the sign bit of the conversion data of n lower bits in the adding process by the digital adder 330, an adding process is performed.

The above described operation corresponds to the section of the difference operation in the timing chart shown in FIG. 5.

(3) Minute Conversion of an Input Analog Signal (Lower Bit Conversion)

The minute conversion is performed on lower bits by performing an analog-to-digital converting operation by the A/D conversion unit 312 for converting lower bits on the analog signal stored by the S/H circuit 302.

The above described operation corresponds to the section of converting lower bits in the timing chart shown in FIG. 5.

(4) Generation of a Digital Conversion Value

The digital adder 330 receives the following data from each component as shown in FIG. 7. That is, it receives a value of 0 as the conversion data of m higher bits from the register 320, the conversion data of n lower bits from the A/D conversion unit 312 for converting lower bits, and sign information to be assigned to the conversion data of n lower bits from the subtraction circuit 306. Then, it receives a digital value of the reference voltage stored in the all bit conversion mode from the internal register 513.

The digital adder 330 generates the final conversion result by performing the adding process of these digital values as shown in FIG. 7.

The above described operation corresponds to the section of converting lower bits in the timing chart shown in FIG. 5.

The difference between the reference voltage and the input analog signal can be equal to or smaller than the input range of the A/D conversion unit 312 for converting lower bits by switching the operation from the above described difference conversion mode into the all bit conversion mode at predetermined intervals, and by updating the reference voltage used in the difference conversion mode.

Thus, two operation modes, that is the all bit conversion mode and the difference conversion mode, can be set in the analog-to-digital converting operation. The power consumption can be reduced by mainly using the difference conversion mode in the power saving operation in which an idle circuit is stopped.

In addition, by alternately switching between the operation in the all bit conversion mode and the operation in the difference conversion mode, the reference voltage used in the difference conversion mode can be updated, and the voltage level of a difference signal can be prevented from exceeding the input range of the A/D conversion unit 312 for converting lower bits, thereby guaranteeing high conversion precision.

As described above, according to the first embodiment of the present invention, the power consumption can be reduced in the difference conversion mode. In addition, the conversion precision can be guaranteed and the power consumption can be reduced by alternately switching between the operation in the all bit conversion mode and the operation in the difference conversion mode. Thus, the present invention is applicable to a power-saving A/D converter in which an analog signal indicates a delicate change.

According to the first embodiment of the present invention, the reference voltage is an analog signal in the all bit conversion mode, but it also can be a fixed voltage. In this case, the converting operation does not require the all bit conversion mode for maintaining the reference voltage, but requires only the difference conversion mode.

Next, the second embodiment of the present invention will be described below by referring to FIGS. 6, 7, 8, and 9.

Figure 8:
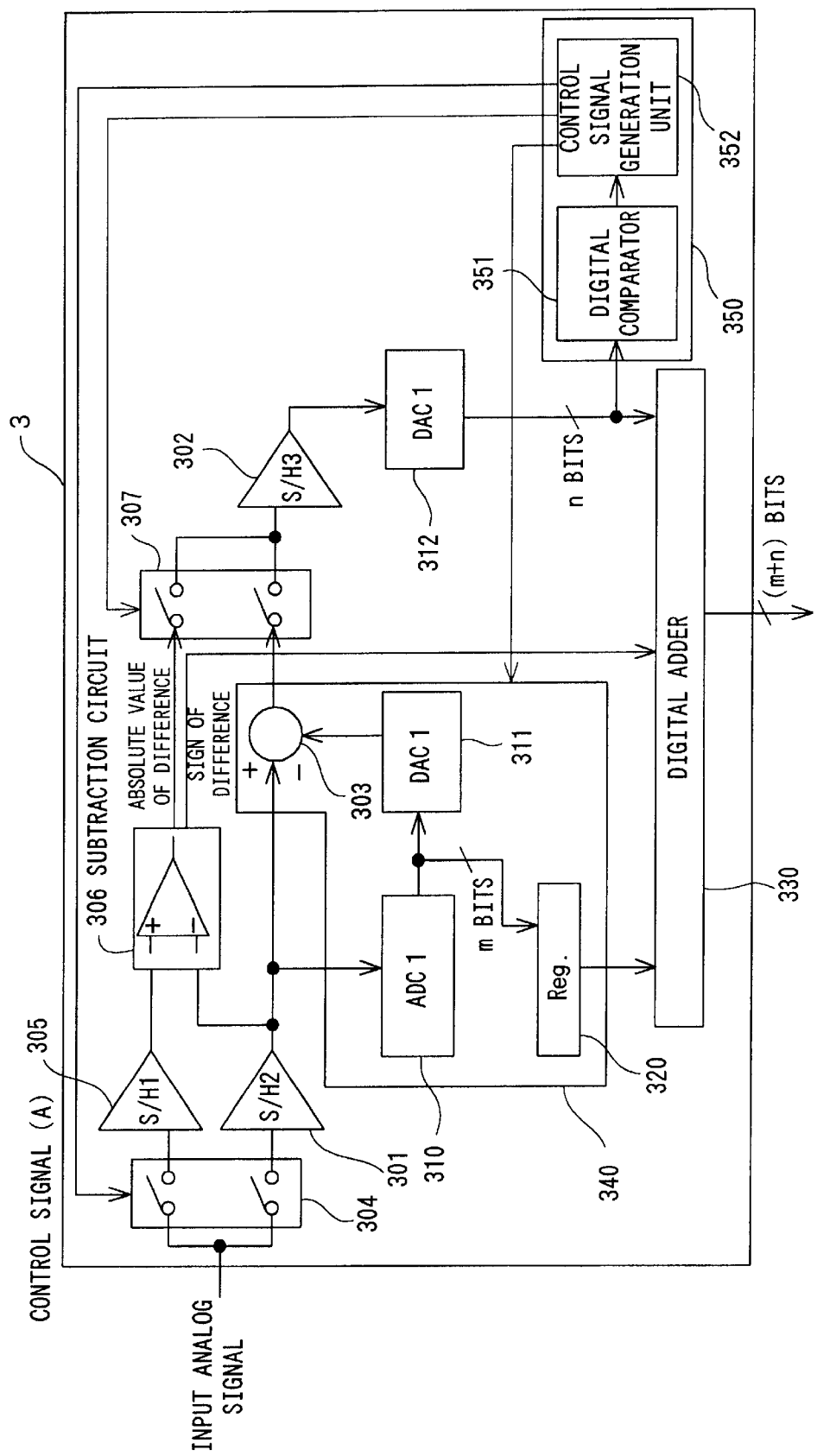
FIG. 8 is a block diagram of the configuration of the A/D converter according to a second embodiment of the present invention.

In FIGS. 8 and 9, components also appearing in the first embodiment of the present invention are assigned the same unit numbers, and the explanation of the components is omitted here, but only the different points are described in detail.

FIG. 8 shows an A/D converter 3 according to the second embodiment of the present invention.

A control circuit 350 comprises a digital comparator 351 and a control signal generation unit 352, and each component has the following function. First, the digital comparator 351 detects an overflow of the conversion data of the A/D conversion unit 312 for converting lower bits by comparing the conversion data with the n bit data in which all bits are set. The comparison result is output to the control signal generation unit 352.

The control signal generation unit 352 generates the control signal of the selectors 304 and 307, and the stop control signal for a higher bit conversion unit 340 based on the result of the digital comparator 351. In addition, when the conversion data of the A/D conversion unit 312 overflows, the operation is switched into the all bit conversion mode, and a request for re-conversion is issued to the A/D converter 3.

FIG. 9 is a timing chart of the converting operation of the A/D converter according to the second embodiment of the present invention. The contents of the analog-to-digital converting operation according to each operation mode are shown in association with the clock signal. In FIG. 9, the second stage shows the converting operation in the all bit conversion mode as in the first embodiment of the present invention. The third stage shows the operation in the difference conversion mode. The operation according to the second embodiment is different from the operation according to the first embodiment in that the conversion is evaluated finally in the converting operation, and that the control circuit 350 determines whether or not the operation is switched to the all bit conversion mode, which is one of the features of the present invention.

The feature of the A/D converter of the present invention is to obtain the difference between an input analog signal and the previously input and stored analog signal, which is the feature of the first embodiment of the present invention, to realize the reduction of power consumption only by the A/D conversion unit for converting lower bits performing the analog-to-digital converting operation on the resultant signal, and to automatically switching the conversion mode using only the A/D conversion unit for converting lower bits and the conversion mode using both A/D conversion units for converting higher and lower bits, thereby realizing the optimum converting operation.

Described below first will be the converting operation in the all bit conversion mode.

The input analog signal converted in the all bit conversion mode is used as a reference voltage of the difference conversion mode. The converting operation in the all bit conversion mode is almost the same as the operation according to the first embodiment as follows.

(1) Sample Holding Operation of an Input Analog Signal

All analog switches of the selector 304 are connected to the circuit according to a control signal, and an input analog signal is sample-held by the S/H circuits 301 and 305. This operation corresponds to the section S/H in the timing chart shown in FIG. 9.

(2) Rough Conversion of an Input Analog Signal (Higher Bit Conversion)

An analog signal stored by the S/H circuit 301 is processed in the analog-to-digital converting operation by the A/D conversion unit 310. In this example, the A/D conversion unit 310 performs a rough converting operation for m higher bits. The converted m higher bit digital signal is stored in the register 511 as converted higher bits.

Concurrently, a process of subtracting an input analog signal is performed by the subtraction circuit 306. In the all bit conversion mode, since a signal input to the subtraction circuit 306 is an input analog signal, the subtraction result is zero, and the sign information output to the digital adder 330 is + (plus).

The above described operation corresponds to the higher bit conversion section in the timing chart shown in FIG. 9.

(3) Regeneration of a Roughly-converted Signal (in the Higher Bit Converting Operation)

The m higher bit digital signal roughly converted in (2) above is regenerated into an analog signal by the D/A conversion unit 311. The conversion is started by the D/A conversion unit 311 immediately after the completion of the conversion by the A/D conversion unit 310 in the previous stage.

The above described operation corresponds to the higher bit conversion section in the timing chart shown in FIG. 9.

(4) Subtracting Process Between an Input Analog Signal and a Rough Conversion Result A subtracting operation between the analog signal generated in (3) above and the analog signal stored by the S/H circuit 301 is performed by the subtraction circuit 303. Thus, among inputs of the input analog signal the component of the converted higher bits of the analog signal can be removed. Then, the operation result obtained by the subtraction circuit 303 is sample-held by the S/H circuit 302 through the selector 307, thereby preparing for the minute conversion (lower bit conversion) at the subsequent stage.

At this time, an analog switch is controlled such that the output of the subtraction circuit 303 can be the output of the selector 307 according to the control signal.

The above described operation corresponds to the higher bit conversion section in the timing chart shown in FIG. 9.

(5) Minute Conversion of an Input Analog Signal (Lower Bit Conversion)

The lower bits are minutely processed by processing an analog signal stored by the S/H circuit 302 again in the analog-to-digital converting operation by the A/D conversion unit 312 for converting lower bits.

The above described operation corresponds to the lower bit conversion section in the timing chart shown in FIG. 9.

(6) Generating a Digital Conversion Value

The digital adder 330 receives the following data from each component as shown in FIG. 6. That is, it receives the conversion data of m higher bits from the register 320, the conversion data of n lower bits from the A/D conversion unit 312 for converting lower bits, and + (plus) sign information from the subtraction circuit 306.

The digital adder 330 regards the sign information of the subtraction circuit 306 as the sign bit of the conversion data of n lower bits, and performs the process of adding the information to the conversion data of m higher bits as shown in FIG. 6, thereby generating the final conversion result.

At this time, the conversion result is stored by the internal register 513 for the operation in the difference conversion mode.

The operation of the A/D converter 3 is switched into the difference conversion mode each time the operation in the all bit conversion mode is performed once.

Described below is the converting operation in the difference conversion mode.

The difference from the reference voltage which is an input analog signal obtained through the conversion in the all bit conversion mode is computed, and the analog-to-digital converting operation is performed only by the A/D conversion unit for converting lower bits. The operation is almost the same as the operation according to the first embodiment, but the process of evaluating a conversion result is added. The converting operation in the difference conversion mode is as follows.

(1) Sample Holding Operation for an Input Analog Signal

According to the control signal, the analog switch of the selector 304 is connected only on the S/H circuit 301 side, and the input analog signal is sample-held by the S/H circuit 301. In the difference conversion mode, the operations of the A/D conversion unit 310 for converting higher bits, the D/A conversion unit 311, and the subtraction circuit 303 are stopped, and the register 320 is reset to enter the initial state according to the stop control signal.

The operation corresponds to the section S/H in the timing chart shown in FIG. 9.

(2) Subtracting Process Between an Input Analog Signal and a Reference Voltage

The subtraction circuit 306 outputs an absolute value of the difference between the reference voltage stored by the S/H circuit 305 and the input analog signal stored by the S/H circuit 301. The operation result is output to the S/H circuit 302 through the selector 307, and stored by the S/H circuit 302. In this example, the selector 307 performs control such that an output of the subtraction circuit 306 can be selected according to the control signal.

In addition, the sign of the difference between the reference voltage and the input analog signal is output to the digital adder 330. The sign of the difference is - (minus) when the reference voltage is larger than the input analog signal, and is + (plus) otherwise. Then, based on the sign bit of the conversion data of n lower bits in the adding process by the digital adder 330, an adding process is performed.

The above described operation corresponds to the section of the difference operation in the timing chart shown in FIG. 9.

(3) Minute Conversion of an Input Analog Signal (Lower Bit Conversion)

The minute conversion is performed on lower bits by performing an analog-to-digital converting operation by the A/D conversion unit 312 on the analog signal stored by the S/H circuit 302.

The above described operation corresponds to the section of converting lower bits in the timing chart shown in FIG. 9.

(4) Generation of a Digital Conversion Value

The digital adder 330 receives the following data from each component as shown in FIG. 7. That is, it receives a value of 0 as the conversion data of m higher bits from the register 320, the conversion data of n lower bits from the A/D conversion unit 312 for converting lower bits, and sign information to be assigned to the conversion data of n lower bits from the subtraction circuit 306. Then, it receives a digital value of the reference voltage stored in the all bit conversion mode from the internal register 513.

The digital adder 330 generates the final conversion result by performing the adding process of these digital values as shown in FIG. 7.

The above described operation corresponds to the section of converting lower bits in the timing chart shown in FIG. 9.

(5) Evaluation of a Conversion Result

The control circuit 350 evaluates a conversion result, and determines the next operation mode based on the result.

That is, the digital comparator 351 first detects an overflow of the conversion data of the A/D conversion unit 312 for converting lower bits by comparing the lower bit conversion data with the n bit data in which all bits are set. When all bits of the lower bit conversion data are set, there is a possibility that the analog signal input to the A/D conversion unit 312 for converting lower bits has exceeded the range of the input voltage of the A/D conversion unit 312. That is, the lower bit conversion data matches the data of an equal number of bits that are all set, it can be considered that the conversion data has overflowed.

Upon receipt of the comparison result, control signal generation unit 352 determines the operation mode.

If the comparison outputs a non-matching result, the A/D conversion unit 312 for converting lower bits indicates that the conversion is normal. Therefore, a control signal is issued to the selectors 304 and 307, and the conversion unit 340 to continue the difference conversion mode. That is, the selector 304 is controlled to operate the analog switch to input the analog signal only to the S/H circuit 301, and the selector 307 is controlled to operate the analog switch to input only the output of the subtraction circuit 306 to the S/H circuit 302. In addition, a control signal is output to the conversion unit 340 to stop the operation.

If the comparison outputs a matching result, then there is a strong possibility that the A/D conversion unit 312 for converting lower bits has received an analog signal exceeding the range of the input voltage, and a control signal is output to the selectors 304 and 307, and the conversion unit 340 to enter the all bit conversion mode. Then, a request is issued to the A/D converter 3 to perform a reconverting operation. That is, the selector 304 is controlled to operate the analog switch to input the analog signal to both S/H circuits 301 and 305, and the selector 307 is controlled to operate the analog switch to input only the output of the subtraction circuit 303 to the S/H circuit 302. In addition, a control signal is output to the conversion unit 340 to start the operation, and a request is issued to the A/D converter 3 to perform a reconverting operation.

Thus, the two operation modes, that is, the all bit conversion mode and the difference conversion mode, are designed for the analog-to-digital converting operation. Power consumption can be reduced by mainly using the difference conversion mode with an idle circuit stopped for a power-saving operation.

In addition, the all bit conversion mode and the difference conversion mode can be switched while monitoring a conversion result, thereby optimizing the converting operation and guaranteeing the conversion precision.

As described above, according to the second embodiment of the present invention, the power consumption can be reduced by using the difference conversion mode. The all bit conversion mode and the difference conversion mode can be switched while monitoring a conversion result, thereby reducing further the power consumption by optimizing the converting operation and guaranteeing the conversion precision. Thus, the present invention is applicable to a power-saving A/D converter in which an analog signal indicates a delicate conversion.

According to the second embodiment of the present invention, the digital comparator 351 compares data between the conversion result of the A/D conversion unit 312 for converting lower bits and the digital value with all bits set. The data can also be compared with the magnitude relation concerning a predetermined digital value. In addition, a signal monitored by the digital comparator 351 can be processed as an output value of the digital adder 330.

According to the second embodiment of the present invention, all digital values obtained as conversion results of the A/D conversion unit 312 for converting lower bits are compared, but it is obvious that the highest bit of the digital value as the conversion result of the A/D conversion unit 312 for converting lower bits can be used as a carry flag, and the digital comparator 351 monitors whether or not the bit is set to detect overflow.

As described above, according to the first embodiment of the present invention, the difference between a reference voltage and an input analog signal is computed, the analog-to-digital converting operation is performed only by the A/D conversion unit 312 for converting lower bits, and the operation of an idle circuit, that is, the conversion unit 340, is stopped, thereby reducing the power consumption. In addition, alternately switching the all bit conversion mode and the difference conversion mode guarantees both conversion precision and reduction of power consumption in the power-saving difference conversion mode.

Furthermore, according to the second embodiment of the present invention, in addition to the reduction of the power consumption in the difference conversion mode which is the effect according to the first embodiment, the all bit conversion mode and the difference conversion mode are switched while monitoring a conversion result, thereby guaranteeing both conversion precision and reduction of power consumption.

Thus, the present invention can provide an A/D converter having the above described excellent effects.

What is claimed is:

1. An A/D converter comprising conversion units, the A/D converter selecting a conversion unit operating at a mode different from an all bit conversion mode, thereby inputting a difference between an input analog signal and a previously input analog signal to at least one of the conversion units, and outputting a sum of an output of the difference from the at least one of the A/D conversion units and an output of said previously input analog signal from the conversion unit operating at the all bit conversion mode.

2. An A/D converter according to claim 1, wherein the output used for said previously input analog signal from the upper and lower bit A/D conversion units is updated at intervals of several cycles of A/D conversion.

3. An A/D converter in which a plurality of A/D conversion units convert input analog signals into digital output signals wherein:

the A/D converter switches between different conversion modes in accordance with the selection of operation of the A/D conversion units;

said analog signals input to said plurality of A/D conversion units and digital signals obtained by said plurality of A/D conversion units are stored;

at least one of said plurality of A/D conversion units is stopped; and a signal obtained by subtracting said analog signal previously stored from said input analog signal is input to remaining A/D conversion units, and a sum of outputs from the remaining A/D conversion units and said stored digital signals is defined as a digital output signal.

4. The A/D converter according to claim 3, wherein:

said stopped part of the A/D conversion units convert higher bits; and said remaining A/D conversion units convert lower bits.

5. An A/D converter according to claim 3, wherein said analog signals input to said plurality of A/D conversion units and digital signals obtained by said plurality of A/D conversion units are stored after every once a plurality of times of converting said analog signal into said digital signal.

6. An A/D converter, comprising:

a first subtraction circuit performing a subtracting operation at least between an input analog signal and a reference voltage, and generating a first signal;

a first A/D conversion unit performing an analog-to-digital converting operation on said input analog signal;

a DA conversion unit performing a digital-to-analog converting operation on a digital signal of said first A/D conversion unit;

a second subtraction circuit performing a subtracting operation between said input analog signal and an analog signal of a first D/A conversion unit, and generating a second signal;

a selection unit selecting one of analog signals of said first signal and said second signal;

a second A/D conversion unit performing an analog-to-digital converting operation on the analog signal selected by said selection unit; and an adder adding up a digital signal of said first A/D conversion unit, a digital signal of said second A/D conversion unit, and a reference digital value, wherein the A/D converter is capable of operating in all bit and difference conversion modes, and if the number of bits is insufficient for conversion, the converter is switchably controlled to the all bit conversion mode;

said reference voltage is the input analog signal which has been previously converted; and said first A/D conversion unit, said D/A conversion unit, and said second subtraction circuit stop when said selection unit selects the first signal.

7. The A/D converter according to claim 6, wherein said selection unit mainly selects said first internally generated signal, and occasionally selects said second internally generated signal at predetermined intervals.

8. The A/D converter according to claim 6, wherein said selection unit can also be controlled according to an external signal.

9. The A/D converter according to claim 6, wherein said reference digital value input to said adder is a digital value corresponding to said reference voltage when said selection unit selects said first internally generated signal, and otherwise a digital value corresponding to a zero level of said input analog signal.

10. An A/D converter, comprising:

a first subtraction circuit performing a subtracting operation at least between an input analog signal and a reference voltage, and generating a first signal;

a first A/D conversion unit performing an analog-to-digital converting operation on said input analog signal;

a DA conversion unit performing a digital-to-analog converting operation on a digital signal of said first A/D conversion unit;

a second subtraction circuit performing a subtracting operation between said input analog signal and an analog signal of a first D/A conversion unit, and generating a second signal;

a selection unit selecting one of analog signals of said first signal and said second signal;

a second A/D conversion unit performing an analog-to-digital converting operation on the analog signal selected by said selection unit;

a comparator comparing a digital signal of said second A/D conversion unit with a first reference digital value;

a control unit generating said control signal based on a result from said comparator; and an adder adding up a digital signal of said first A/D conversion unit, a digital signal of said second A/D conversion unit, and a second reference digital value, wherein the A/D converter is capable of operating in all bit and difference conversion modes, and if the number of bits is insufficient for conversion, the converter is switchably controlled to the all bit conversion mode;

said reference voltage is the input analog signal which has been previously converted; and said first A/D conversion unit, said D/A conversion unit, and said second subtraction circuit stop when said selection unit selects the first signal.

11. The A/D converter according to claim 10, wherein said selection unit can also be controlled according to an external signal.

12. The A/D converter according to claim 10, wherein said control signal controls said selection unit to select a first internally generated signal when a digital signal of said second A/D conversion unit is smaller than said first reference digital value, and otherwise to select said second internally generated signal.

13. The A/D converter according to claim 10, wherein said first reference digital value input to said comparator is equal to a full scale value of said second A/D conversion unit.

14. The A/D converter according to claim 10, wherein said second reference digital value input to said adder is a digital value corresponding to said reference voltage when said selection unit selects said first internally generated signal, and otherwise is a digital value corresponding to a zero level of said input analog signal.

* * * * *